(12) United States Patent
Liu et al.

(10) Patent No.: US 8,981,862 B2
(45) Date of Patent: Mar. 17, 2015

(54) CANCELLING SUPPLY NOISE IN A VOLTAGE CONTROLLED OSCILLATOR CIRCUIT

(71) Applicant: QUALCOMM Incorporated, San Diego, CA (US)

(72) Inventors: Li Liu, San Diego, CA (US); Chiewcharn Narathong, Laguna Niguel, CA (US)

(73) Assignee: QUALCOMM Incorporated, San Diego, CA (US)

( * ) Notice: Subject to any disclaimer, the term of this patent is extended or adjusted under 35 U.S.C. 154(b) by 85 days.

(21) Appl. No.: 13/755,130

(22) Filed: Jan. 31, 2013

(65) Prior Publication Data

US 2014/0070899 A1 Mar. 13, 2014

Related U.S. Application Data

(60) Provisional application No. 61/700,533, filed on Sep. 13, 2012.

(51) Int. Cl.
| | |
|---|---|
| *H03B 5/12* | (2006.01) |
| *H03C 3/22* | (2006.01) |
| *H03L 1/00* | (2006.01) |
| *H01L 25/00* | (2006.01) |
| *H03B 5/04* | (2006.01) |
| *H03L 7/099* | (2006.01) |

(52) U.S. Cl.
CPC .............. *H03B 5/1228* (2013.01); *H01L 25/00* (2013.01); *H03B 5/04* (2013.01); *H03L 1/00* (2013.01); *H03L 7/099* (2013.01); *H03B 5/1243* (2013.01); *H03B 5/1209* (2013.01); *H03B 2200/0088* (2013.01)

USPC .................. 331/186; 331/117 FE; 331/177 V

(58) Field of Classification Search
USPC ............. 331/117 FE, 117 R, 177 V, 185, 186
See application file for complete search history.

(56) References Cited

U.S. PATENT DOCUMENTS

| | | | | |
|---|---|---|---|---|
| 5,955,929 A * | 9/1999 | Moon et al. | ...................... | 331/57 |
| 6,271,731 B2 * | 8/2001 | Koszarsky | .................. | 331/36 C |
| 6,271,737 B1 * | 8/2001 | Watkinson | ..................... | 331/183 |
| 6,281,758 B1 * | 8/2001 | Elsayed et al. | .................. | 331/16 |
| 6,724,273 B1 * | 4/2004 | Jones | ......................... | 331/177 V |
| 6,853,262 B2 * | 2/2005 | Feilkas et al. | ............. | 331/117 R |

(Continued)

FOREIGN PATENT DOCUMENTS

WO WO-9952214 A2 10/1999

OTHER PUBLICATIONS

International Search Report and Written Opinion—PCT/US2013/059757—ISA/EPO—Jan. 31, 2014.

(Continued)

*Primary Examiner* — Levi Gannon
(74) *Attorney, Agent, or Firm* — Kevin T. Cheatham

(57) ABSTRACT

A voltage controlled oscillator (VCO) core for cancelling a supply noise is described. The VCO core includes an input node that receives the supply noise. The VCO core also includes a noise path coupled to the input node. The VCO core additionally includes a cancellation path coupled to the input node and the noise path. The cancellation path includes a programmable gain circuit coupled with a first terminal of a varactor. The supply noise passes through the programmable gain circuit to produce a cancellation noise.

32 Claims, 11 Drawing Sheets

(56) References Cited

U.S. PATENT DOCUMENTS

| | | | |
|---|---|---|---|
| 6,882,237 B2 * | 4/2005 | Singh et al. | 331/185 |
| 6,947,720 B2 | 9/2005 | Razavi et al. | |
| 7,042,302 B2 | 5/2006 | Chien | |
| 7,187,246 B2 * | 3/2007 | Sandner | 331/175 |
| 7,193,484 B2 | 3/2007 | Maeda | |
| 7,579,920 B1 * | 8/2009 | Bolton et al. | 331/185 |
| 8,134,418 B2 * | 3/2012 | Jiang | 331/177 V |
| 8,462,036 B2 * | 6/2013 | Narathong et al. | 341/154 |
| 2004/0251977 A1 * | 12/2004 | Bellaouar et al. | 331/117 R |
| 2011/0215876 A1 | 9/2011 | Bao et al. | |
| 2012/0082151 A1 * | 4/2012 | Liu et al. | 370/342 |

OTHER PUBLICATIONS

Elshazly, et al., "A 0.4-to-3GHz Digital PLL with Supply-Noise Cancellation Using Deterministic Background Calibration," IEEE International Solid-State Circuits Conference, Feb. 21, 2011, pp. 92-94.

Maxim, A., "A multi-rate 9.953-12.5-GHz 0.2-µm SiGe BiCMOS LC oscillator using a resistor-tuned varactor and a supply pushing cancellation circuit," IEEE Journal of Solid-State Circuits, Apr. 2006, pp. 918-934, vol. 41, Iss. 4.

* cited by examiner

CANCELLING SUPPLY NOISE IN A VOLTAGE CONTROLLED OSCILLATOR CIRCUIT

RELATED APPLICATIONS AND PRIORITY CLAIM

This application is related to and claims priority from U.S. Provisional Patent Application Ser. No. 61/700,533, filed Sep. 13, 2012, for "CANCELLING SUPPLY NOISE IN A VOLTAGE CONTROLLED OSCILLATOR CIRCUIT".

TECHNICAL FIELD

The present disclosure relates generally to electronic devices. More specifically, the present disclosure relates to cancelling supply noise in a voltage controlled oscillator (VCO) circuits.

BACKGROUND

Electronic devices (cellular telephones, wireless modems, computers, digital music players, Global Positioning System units, Personal Digital Assistants, gaming devices, etc.) have become a part of everyday life. Small computing devices are now placed in everything from automobiles to housing locks. The complexity of electronic devices has increased dramatically in the last few years. For example, many electronic devices have one or more processors that help control the device, as well as a number of digital circuits to support the processor and other parts of the device.

Wireless communication systems are widely deployed to provide various types of communication content such as voice, video, data and so on. These systems may be multiple-access systems capable of supporting simultaneous communication of multiple wireless communication devices with one or more base stations.

Mobile devices may include a variety of circuits used during operation. One of these circuits may be a voltage controlled oscillator (VCO). Therefore, benefits may be realized by cancelling supply noise in a voltage controlled oscillator (VCO).

SUMMARY

A voltage controlled oscillator (VCO) core for cancelling a supply noise is described. The VCO core includes an input node that receives the supply noise. The voltage controlled oscillator (VCO) core also includes a noise path coupled to the input node. The VCO core additionally includes a cancellation path coupled to the input node and the noise path. The cancellation path includes a programmable gain circuit coupled with a first terminal of a varactor. The supply noise passes through the programmable gain circuit to produce a cancellation noise.

The supply noise may include a combination of a power supply noise and a regulator noise. The supply noise may also include one or more of a random noise and a tone. The programmable gain circuit may be adjusted to minimize a VCO core output noise.

The noise path may also include a capacitor coupled to a second terminal of the varactor. The supply noise may pass through the capacitor to produce a modified noise. The programmable gain circuit may also be adjusted until a difference between the cancellation noise and the modified noise is minimized. A tuning voltage may be coupled to a first side of a resistor. A second side of the resistor may be coupled between the capacitor and the varactor.

The VCO core may also include a second cancellation path coupled to the input node and the noise path. The second cancellation path may include a second programmable gain circuit coupled with a first terminal of a second varactor. The supply noise may pass through the second programmable gain circuit to produce a second cancellation noise.

The VCO core may additionally include a second noise path coupled to the noise path. The second noise path may include a second capacitor coupled with a second terminal of the second varactor. The supply noise may pass through the second capacitor to produce a second modified noise.

The tuning voltage may be coupled to a first side of a second resistor. A second side of the second resistor may be coupled between the second capacitor and the second varactor.

The second programmable gain circuit may be adjusted until a difference between the second cancellation noise and the second modified noise is minimized. The programmable gain circuit may be controlled by a first control code, and the second programmable gain circuit may be controlled by a second control code.

The VCO core may also include a second noise path coupled to the noise path. The second noise path may include a second capacitor coupled with a first terminal of a second varactor. The supply noise may pass through the second capacitor to produce a second modified noise.

The VCO core may additionally include a first bias voltage coupled to a first side of a first resistor. A second side of the first resistor may be coupled between the capacitor and the varactor.

The VCO core may further include a tuning voltage applied to a first side of a second resistor. A second side of the second resistor may be coupled between the second capacitor and a first terminal of the second varactor.

The VCO core may also include a second bias voltage applied to a second terminal of the second varactor. The programmable gain circuit may be adjusted until a difference between the cancellation noise and the modified noise is minimized.

The noise path may also include a capacitor coupled to a first terminal of a second varactor. The supply noise may pass through the capacitor to produce a modified noise. The second terminal of the varactor may be coupled between the capacitor and the second varactor. A bias voltage may be coupled to a first side of a resistor. A second side of the resistor may be coupled between the capacitor and the second varactor. A tuning voltage may be coupled to a second terminal of the second varactor.

The programmable gain circuit may include a resistor ladder switch assembly. The resistor ladder switch assembly may include a plurality of coupled resistors. The resistor ladder switch assembly may also include a plurality of switches coupled to junctions of the resistors. The gain may be based on a state of the switches. The state of the switches may be based on a control code. The control code may be based on one of a single predetermined code or an adaptive control determined during operation of the VCO core.

A method for cancelling a supply noise in a voltage controlled oscillator (VCO) core is also described. A supply noise is received. The supply noise is modified using a capacitor coupled to a varactor to produce a modified noise. A cancellation noise is produced by passing the supply noise through a programmable gain circuit. The programmable gain circuit is adjusted until a difference between the cancellation noise and the modified noise is minimized.

An apparatus for cancelling a supply noise in a voltage controlled oscillator (VCO) core is also described. The apparatus includes means for receiving the supply noise into the VCO core. The apparatus also includes means for modifying the supply noise using a capacitor coupled to a varactor to produce a modified noise. The apparatus additionally includes means for producing a cancellation noise by passing the supply noise through a programmable gain circuit. The apparatus further includes means for adjusting the programmable gain circuit until a difference between the cancellation noise and the modified noise is minimized.

An integrated circuit is also described. The integrated circuit includes an input node that receives a supply noise. The integrated circuit also includes a noise path coupled to the input node. The integrated circuit additionally includes a cancellation path coupled to the input node and the noise path. The cancellation path includes a programmable gain circuit coupled with a first terminal of a varactor. The supply noise passes through the programmable gain circuit to produce a cancellation noise.

DETAILED DESCRIPTION

Figure 1:
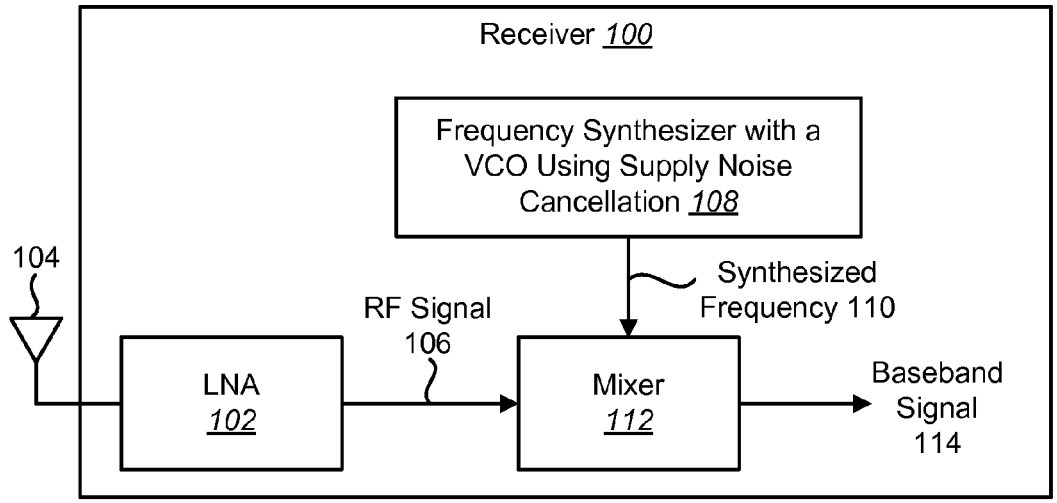
FIG. 1 is a block diagram illustrating a receiver for cancelling supply noise in a voltage controlled oscillator (VCO) circuit.

Mobile devices may include a variety of circuits used during operation. A mobile device may include a power management circuit, a wireless transceiver, a baseband processor, a memory module or application processor. A common power management circuit may provide supply to different wireless systems (e.g., cellular, wireless local area network (LAN), Bluetooth, global positioning system (GPS), etc.) inside the mobile device. Each wireless system may include a transmitter, a receiver and a frequency synthesizer. The frequency synthesizer may include a voltage controlled oscillator (VCO), a frequency divider, phase detector, charge pump and a loop filter.

Voltage controlled oscillators (VCOs) may be used to produce a local oscillator signal for a mixer that may be used in an upconverter in a transmitter or a downconverter in the receiver. The phase noise and spurious of the voltage controlled oscillator (VCO) signal may impact the spurious performance of a transmitter and the blocking performance of a receiver. The voltage controlled oscillator (VCO) may work concurrently with other circuits. The voltage controlled oscillator (VCO) and the other circuits may receive a common supply from a common power management circuit. The power management circuit may have noise and spurious due to switching activity inside the power management circuit. The noise and switching activity of other circuits may be seen by the voltage controlled oscillator (VCO) through the common portion of the supply network. Furthermore, different circuits may be powered on or off during operation, which may cause supply glitches. Therefore, benefits may be realized by cancelling supply noise in a voltage controlled oscillator (VCO).

A voltage controlled oscillator (VCO) core may be used to produce an output signal with a frequency based on a VCO input signal. For example, one or more voltage controlled oscillator (VCO) cores may be used in a phase locked loop (PLL) to generate oscillating signals that are locked, relative to an input reference clock, in phase, frequency or both. A voltage controlled oscillator (VCO) core may receive a supply voltage (Vdd) in order to operate. Voltage controlled oscillator (VCO) phase noise may degrade when external noise (e.g., from a supply voltage) is injected to a voltage controlled oscillator (VCO). Such noise may take a noise path to a VCO tank, which may include an inductor, capacitor and a varactor. The present systems and methods may include a noise cancellation path that takes the external noise and injects it to the bias point of the varactor. By properly setting the gain or attenuation of the noise cancellation path, the total noise appearing at the voltage controlled oscillator (VCO) may be cancelled or minimized.

A regulator may be used to minimize supply noise before it enters the voltage controlled oscillator (VCO) core, but at the expense of increased current consumption and area. Furthermore, a regulator may add its own noise. Therefore, even in a configuration with a regulator, the present systems and methods may use noise cancellation to reduce the output noise of the voltage controlled oscillator (VCO) core. Specifically, one or more cancellation paths may be configured to cancel out the effects of the supply noise. The cancellation paths may include a programmable gain (G) that may produce a cancellation noise. The programmable gain (G) may be adjusted to minimize the output noise of the voltage controlled oscillator (VCO) core. Therefore, the present systems and methods may reduce the sensitivity of the voltage controlled oscillator (VCO) core to external noise such as supply noise.

FIG. 1 is a block diagram illustrating a receiver 100 for cancelling supply noise in a voltage controlled oscillator (VCO) circuit. The receiver 100 may be part of a mobile device or base station designed for wireless communication. The receiver 100 may include, among other things, a low noise amplifier (LNA) 102, a frequency synthesizer with a VCO using supply noise cancellation 108 and a mixer 112. The LNA 102 may receive a wireless communication signal from an antenna 104. The LNA 102 may amplify the received signal to usable levels and produce a radio frequency (RF) signal 106, i.e., a representation of the original signal sent.

The frequency synthesizer with a voltage controlled oscillator (VCO) using supply noise cancellation 108 may output a synthesized frequency 110 directed to a particular application. The synthesized frequency 110 may have relatively low noise based on the use of one or more cancellation paths in a voltage controlled oscillator (VCO) core. The frequency synthesizer with a voltage controlled oscillator (VCO) using supply noise cancellation 108 may be capable of producing different frequencies. Although illustrated in the receiver 100, the frequency synthesizer with a voltage controlled oscillator (VCO) using supply noise cancellation 108 may be used in various applications in a mobile device or base station designed for wireless communication. The mixer 112 may receive the RF signal 106 from the LNA 102 and the synthesized frequency 110 from the frequency synthesizer with a voltage controlled oscillator (VCO) using supply noise cancellation 108 and produce a baseband signal 114. The baseband signal 114 may be the actual reconstructed audio received by a microphone on a transmitting device, e.g., voiced speech or other kinds of data. Thus, the receiver 100 may use the mixer 112 to reconstruct the baseband signal 114.

Figure 2:
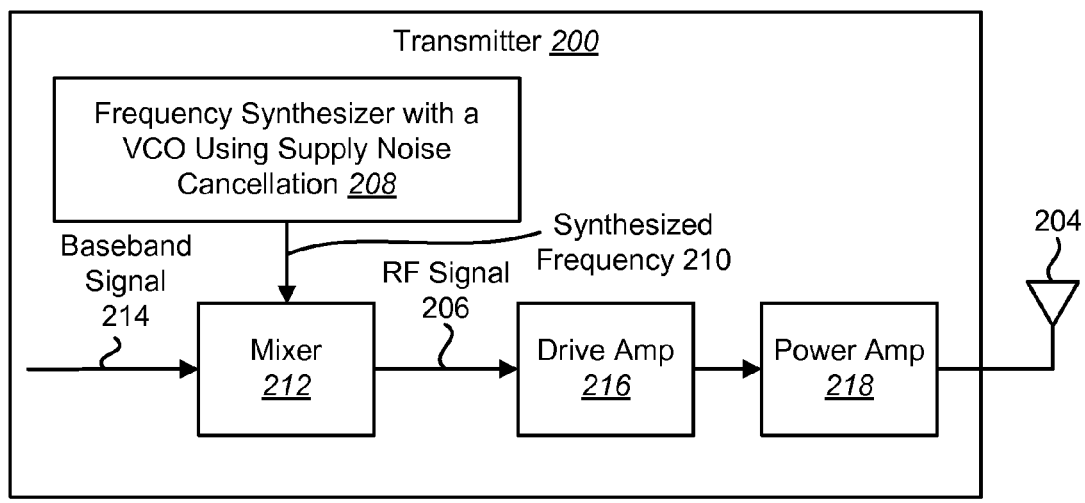
FIG. 2 is a block diagram illustrating a transmitter for cancelling supply noise in a voltage controlled oscillator (VCO) circuit.

FIG. 2 is a block diagram illustrating a transmitter 200 for cancelling supply noise in a voltage controlled oscillator (VCO) circuit. The transmitter 200 may be part of a mobile device or base station that may also include the receiver 100 illustrated in FIG. 1. The transmitter 200 may include, among other things, a frequency synthesizer with a voltage controlled oscillator (VCO) using supply noise cancellation 208, a mixer 212, a drive amplifier 216 and a power amplifier 218. Like before, the frequency synthesizer with a voltage controlled oscillator (VCO) using supply noise cancellation 208 may produce the synthesized frequency 210. The synthesized frequency 210 may have relatively low noise based on the use of one or more cancellation paths in a voltage controlled oscillator (VCO) core. The mixer 212 may receive the synthesized frequency 210 and a baseband signal 214 (e.g., voiced speech), and produce an RF signal 206. In other words, the transmitter 200 may use the mixer 212 to produce a modulated, high-frequency RF signal 206 to be transmitted. Before the RF signal 206 is transmitted via an antenna 204, it may be amplified by a drive amplifier 216, a power amplifier 218 or both. Thus, the transmitter 200 may use the mixer 212 to construct an RF signal 206 for transmission.

Figure 3:
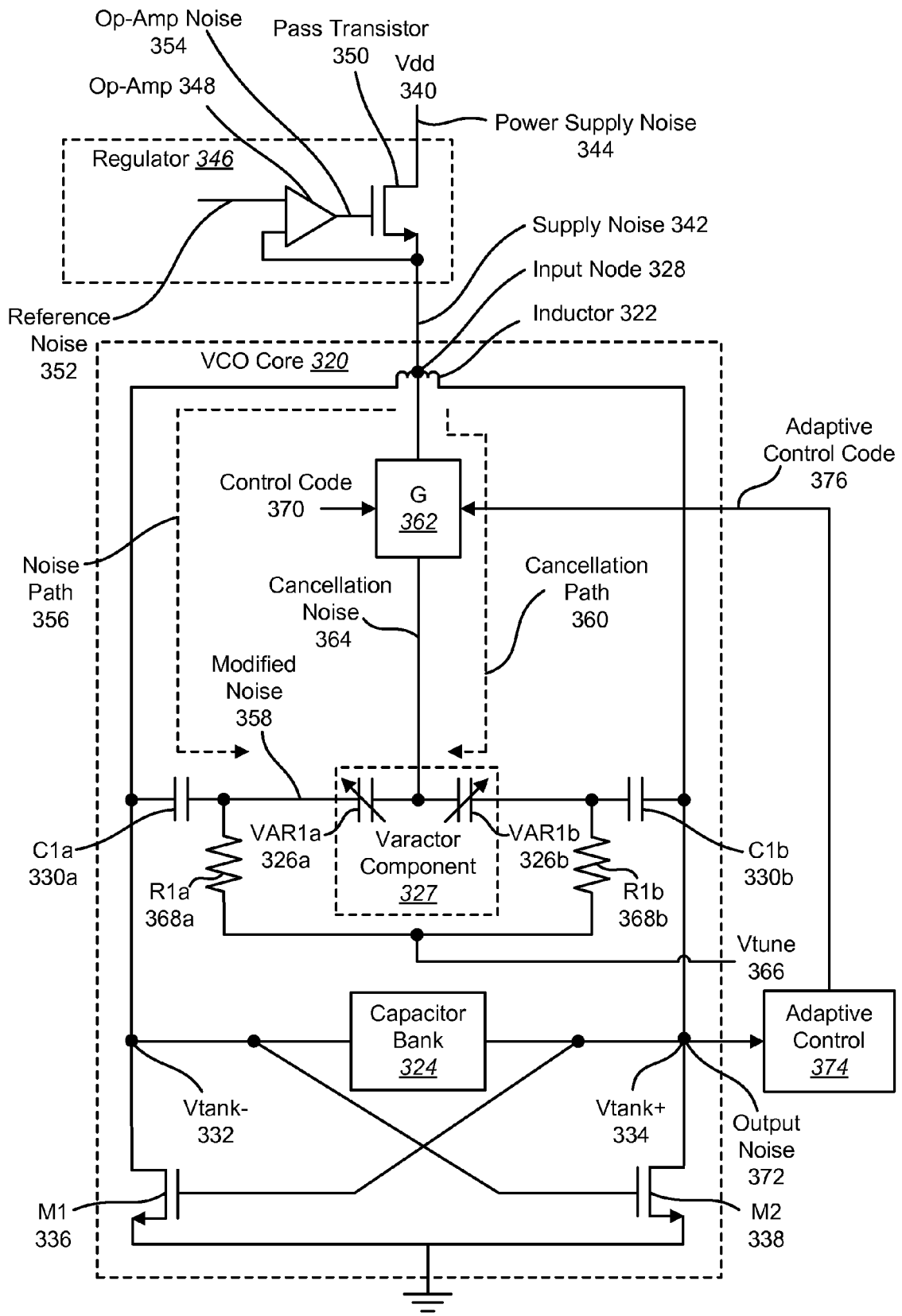
FIG. 3 is a circuit diagram illustrating a voltage controlled oscillator (VCO) core with a cancellation path.

FIG. 3 is a circuit diagram illustrating a voltage controlled oscillator (VCO) core 320 with a cancellation path 360. The voltage controlled oscillator (VCO) core 320 may include one or more inductors 322, a capacitor bank 324 and a varactor component 327. The inductor 322, capacitor bank 324 and varactor component 327 form the tank of the voltage controlled oscillator (VCO). The capacitor bank 324 may be a switchable capacitor bank. The voltage controlled oscillator (VCO) core 320 may also include an input node 328 to which the inductor 322 may be coupled. The voltage controlled oscillator (VCO) core 320 may include outputs Vtank− 332 and Vtank+ 334.

The varactor component 327 may include a first varactor (VAR1a) 326a and second varactor (VAR1b) 326b. A varactor may include a diode (e.g., varicap diode, varactor diode, variable capacitance diode, variable reactance diode, tuning diode, etc.) that has a variable capacitance that is a function of the voltage impressed on its terminals. In some configurations, the varactor component 327 may be a noise cancellation varactor. A first terminal (e.g., an anode) of the first varactor (VAR1a) 326a may be coupled to a first terminal of the second varactor (VAR1b) 326b. A second terminal (e.g., a cathode) of the first varactor (VAR1a) 326a may be coupled to a first capacitor (C1a) 330a. A second terminal (e.g., a cathode) of the second varactor (VAR1b) 326b may be coupled to a second capacitor (C1b) 330b. It should be noted that the cathode and anode of the varactor may also be flipped.

The voltage controlled oscillator (VCO) core 320 may additionally include a first n-type metal-oxide-semiconductor (NMOS) field effect transistor M1 336 with the source of M1 336 connected to ground and the drain of M1 336 connected to an output Vtank− 332 of the voltage controlled oscillator (VCO) core 320. The gate of M1 336 may be connected to an output Vtank+ 334 of the voltage controlled oscillator (VCO) core 320. The voltage controlled oscillator (VCO) core 320 may include a second NMOS transistor M2 338, with the source of M2 338 connected to ground and the drain of M2 338 connected to the output Vtank+ 334. The gate of M2 338 may be connected to the output Vtank− 332. The VCO core 320 may also include complementary structures (NMOS and PMOS).

The voltage controlled oscillator (VCO) core 320 may receive a supply voltage (Vdd) 340 at an input node 328. The supply voltage (Vdd) 340 may include a supply noise 342. As used herein, "noise" may be a random fluctuation in an electrical signal (e.g., voltage). Noise may additionally include a combination of one or more random noises and/or one or more undesirable tones that may be included in the supply voltage (Vdd) 340.

In one configuration, the supply voltage (Vdd) 340 may be received by the voltage controlled oscillator (VCO) core 320 directly from an external power supply. The supply voltage (Vdd) 340 received from the external power supply may include a power supply noise 344, which may include the supply noise 342 received by the voltage controlled oscillator (VCO) core 320.

In another optional configuration, the supply voltage (Vdd) 340 may first pass through a regulator 346 before entering the voltage controlled oscillator (VCO) core 320. A regulator 346 may include an op-amp 348 and a pass transistor 350. The op-amp 348 may receive a reference voltage from a bias circuit (not shown) that may include a reference noise 352. Additionally, during operation, the op-amp 348 may produce an additional op-amp noise 354. Therefore, in one configuration, the reference noise 352 and the op-amp noise 354 may combine with the power supply noise 344 to produce the supply noise 342 that may enter the voltage controlled oscillator (VCO) core 320.

The voltage controlled oscillator (VCO) core 320 may include a noise path 356. For example, the noise path 356 may include a conductive path (e.g., an electrical circuit) across which a voltage potential may exist. The supply noise 342 may be received into the voltage controlled oscillator (VCO) core 320 at the input node 328. For example, the supply noise 342 may enter the voltage controlled oscillator (VCO) core 320 via the supply voltage (Vdd) 340. The supply noise 342 may follow the noise path 356. The noise path 356 may include a capacitor (C1a) 330a. The supply noise 342 may cross the capacitor (C1a) 330a to produce a modified noise 358.

The voltage controlled oscillator (VCO) core 320 may also include a cancellation path 360. For example, the cancellation path 360 may include a conductive path (e.g., an electrical circuit) across which a voltage potential may exist. The cancellation path 360 may connect to the input node 328 on one end and connect to the junction of the varactors (VAR1a) 326a and (VAR1b) 326b at the other end. The cancellation path 360 may include a programmable gain (G) 362. The programmable gain (G) 362 may include functionality to modify the supply noise 342 to produce a cancellation noise 364, which may be impressed on a first terminal of the first varactor (VAR1a) 326a.

The programmable gain (G) 362 may be implemented in hardware, software or a combination of hardware and software. The programmable gain (G) 362 may be implemented with a plurality of circuit components. For example, the circuitry 102 may include one or more resistors, capacitors, inductors, transistors, logic gates, registers, memory cells, processing blocks and/or switches, etc. For instance, the circuitry 102 may be implemented as an integrated circuit, an application-specific integrated circuit (ASIC), field-programmable gate array (FPGA), etc. The programmable gain (G) 362 may additionally be a programmable gain circuit or a programmable gain module. In one configuration, the programmable gain (G) 362 may include a resistor ladder switch assembly as described below in FIG. 9.

The voltage controlled oscillator (VCO) core 320 may also include a tuning voltage (Vtune) 366. The tuning voltage (Vtune) 366 may cause the voltage controlled oscillator (VCO) core 320 to oscillate at a particular frequency. In one configuration, the tuning voltage (Vtune) 366 may be supplied by a phase-locked loop (PLL) as part of a frequency synthesizer 108. The tuning voltage (Vtune) 366 may be coupled to a first side of a resistor (R1a) 368a and a second side of the resistor (R1a) 368a may be coupled between the capacitor (C1a) 330a and the varactor (VAR1a) 326a. The tuning voltage (Vtune) 366 may additionally be coupled to a first side of a resistor (R1b) 368b and a second side of the resistor (R1b) 368b may be coupled between the capacitor (C1b) 330b and the varactor (VAR1b) 326b.

Noise cancellation may be optimized when the difference between the cancellation noise 364 and the modified noise 358 is minimized. For example, optimum noise cancellation may occur when the cancellation noise 364 and modified noise 358 on either side of the varactor (VAR1a) 326a are equal. In other words, when the cancellation noise 364 and the modified noise 358 are equalized, the voltage difference across the varactor (VAR1a) 326a may be zero. Because the capacitance of the varactor (VAR1a) 326a may be a function of the voltages impressed on its terminals, when the noise voltages (e.g., the modified noise 358 and cancellation noise 364) at each terminal of the varactor (VAR1a) 326a are equalized, the capacitance of the varactor (VAR1a) 326a may not change due to noise. This may result in reduced voltage controlled oscillator (VCO) core 320 frequency variation. Because the voltage controlled oscillator (VCO) core 320 frequency variation (e.g., frequency noise) is reduced, the voltage controlled oscillator (VCO) core 320 phase noise is minimized as well.

The programmable gain (G) 362 may be controlled based on a control code 370. In one configuration, the control code 370 may be based on a single predetermined code. For example, a known tuning voltage (Vtune) 366 may be applied to the voltage controlled oscillator (VCO) core 320. Additionally, a supply voltage (Vdd) 340 may be provided with a known supply noise 342. The programmable gain (G) 362 may be adjusted until the observed output noise 372 is minimized. The output noise 372 may be determined by measuring the voltage differential at the outputs Vtank− 332 and Vtank+ 334.

In one configuration, the control code 370 for the programmable gain (G) 362 may be determined by applying a known tone to the voltage controlled oscillator (VCO) core 320. For example, a known tuning voltage (Vtune) 366 may be applied to the voltage controlled oscillator (VCO) core 320 as described above. The voltage controlled oscillator (VCO) core 320 may oscillate at a core frequency (f0). A supply voltage (Vdd) 340 may be provided with a known tone at a tone frequency (df) which simulates random noise fluctuations. The tone may be modulated by the voltage controlled oscillator (VCO) core 320 and may generate a spurious tone at f0+/−df. The programmable gain (G) 362 may be adjusted (e.g., by iteratively varying the control code 370 sent to the programmable gain (G) 362) until the observed output tone is minimized. The output tone may be determined by measuring the voltage differential at the outputs Vtank− 332 and Vtank+ 334 through a test buffer. The output tone may also be measured from the baseband signal 114 at a frequency equal to the tone frequency (df).

In another optional configuration, the control code 370 may be determined through an adaptive control 374. For example, the output noise 372 may be actively monitored by the adaptive control 374. In one configuration, the adaptive control 374 may include a feedback loop through which the adaptive control 374 may issue adaptive control codes 376 to the programmable gain (G) 362. For instance, as the output noise 372 may increase, the adaptive control 374 may issue different adaptive control codes 376 until the output noise 372 may be minimized.

For clarity, only one noise path 356 has been described. However, it will be appreciated that a symmetrical noise path may originate from the input node 328. Furthermore, the cancellation noise 364 may also be impressed on the second varactor (VAR1b) 326b.

As described above, the use of a regulator 346 may be optional. If a regulator 346 may be used, the described systems and methods for cancelling a supply noise 342 in a voltage controlled oscillator (VCO) core 320 may further relieve problems associated with low headroom for the regulator 346. As used herein, "headroom" may refer to the total amount of supply voltage (Vdd) 340 that may be supplied compared to the power requirements of the various components in an electronic device. For example, the external power supply may provide 2 volts. The voltage controlled oscillator (VCO) core 320 may receive 1.8 volts, leaving a headroom of 0.2 volts for the regulator 346 to operate. Assuming the regulator 346 does not operate effectively at 0.2 volts, the headroom may be low and the regulator 346 may not effectively reject power supply noise 344. This may cause the supply noise 342 to be high, which may in turn cause output noise 372 to be high. However, the described systems and methods for cancelling a supply noise 342 in a voltage controlled oscillator (VCO) core 320 may improve output noise 372 when a regulator 346 may be used with a low headroom.

Figure 4:
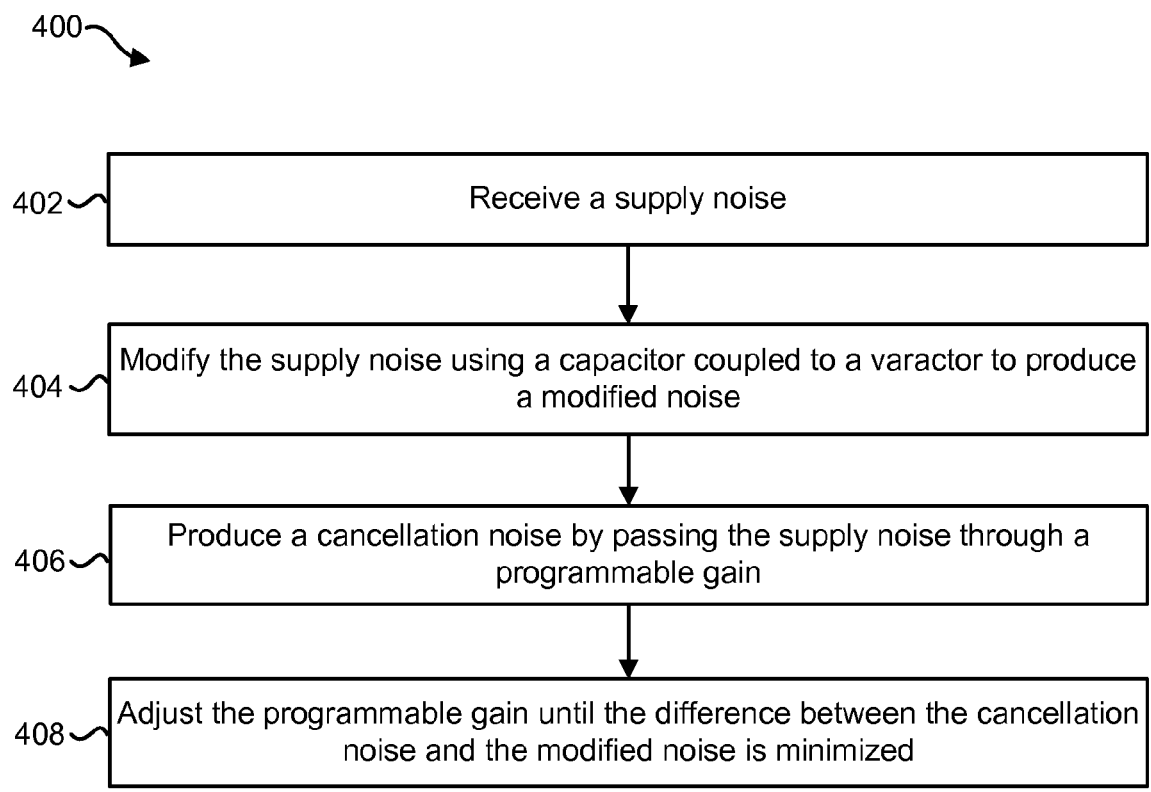
FIG. 4 is a flow diagram illustrating a method for cancelling a supply noise in a voltage controlled oscillator (VCO) core.

FIG. 4 is a flow diagram illustrating a method 400 for cancelling a supply noise 342 in a voltage controlled oscillator (VCO) core 320. The method 400 may be performed by a voltage controlled oscillator (VCO) core 320. The voltage controlled oscillator (VCO) core 320 may receive 402 a supply noise 342. For example, the voltage controlled oscillator (VCO) core 320 may include an input node 328 that may receive 402 the supply noise 342. In one configuration, the supply noise 342 may originate from an external power supply. In another configuration, the supply noise 342 may be a combination of a power supply noise 344 and the noise contributed by a regulator 346 (e.g., a reference noise 352 and an op-amp noise 354).

The voltage controlled oscillator (VCO) core 320 may modify 404 the supply noise 342 using a capacitor (C1a) 330a coupled to a varactor (VAR1a) 326a to produce a modified noise 358. For example, the voltage controlled oscillator (VCO) core 320 may include a noise path 356. The noise path 356 may include a conductive path (e.g., an electrical circuit)

across which a voltage potential may exist. The supply noise 342 may follow the noise path 356. The noise path 356 may include the capacitor (C1a) 330a coupled to the varactor (VAR1a) 326a. The supply noise 342 may cross the capacitor (C1a) 330a to produce a modified noise 358.

The voltage controlled oscillator (VCO) core 320 may produce 406 a cancellation noise 364 by passing the supply noise 342 through a programmable gain (G) 362. For example, the voltage controlled oscillator (VCO) core 320 may include a cancellation path 360. The cancellation path 360 may connect to the input node 328 on one end and connect to the varactor (VAR1a) 326a at the other end. The cancellation path 360 may include the programmable gain (G) 362. The programmable gain (G) 362 may modify the supply noise 342 to produce 406 a cancellation noise 364.

The voltage controlled oscillator (VCO) core 320 may adjust 408 the programmable gain (G) 362 until the difference between the cancellation noise 364 and the modified noise 358 is minimized Noise cancellation may be optimized when the difference between the cancellation noise 364 and the modified noise 358 is minimized. The voltage controlled oscillator (VCO) core 320 may adjust the programmable gain (G) 362 based on a control code 370. In one configuration, the control code 370 may be based on a single predetermined code. In another configuration, the control code 370 may be based on an adaptive control 374.

Figure 5:
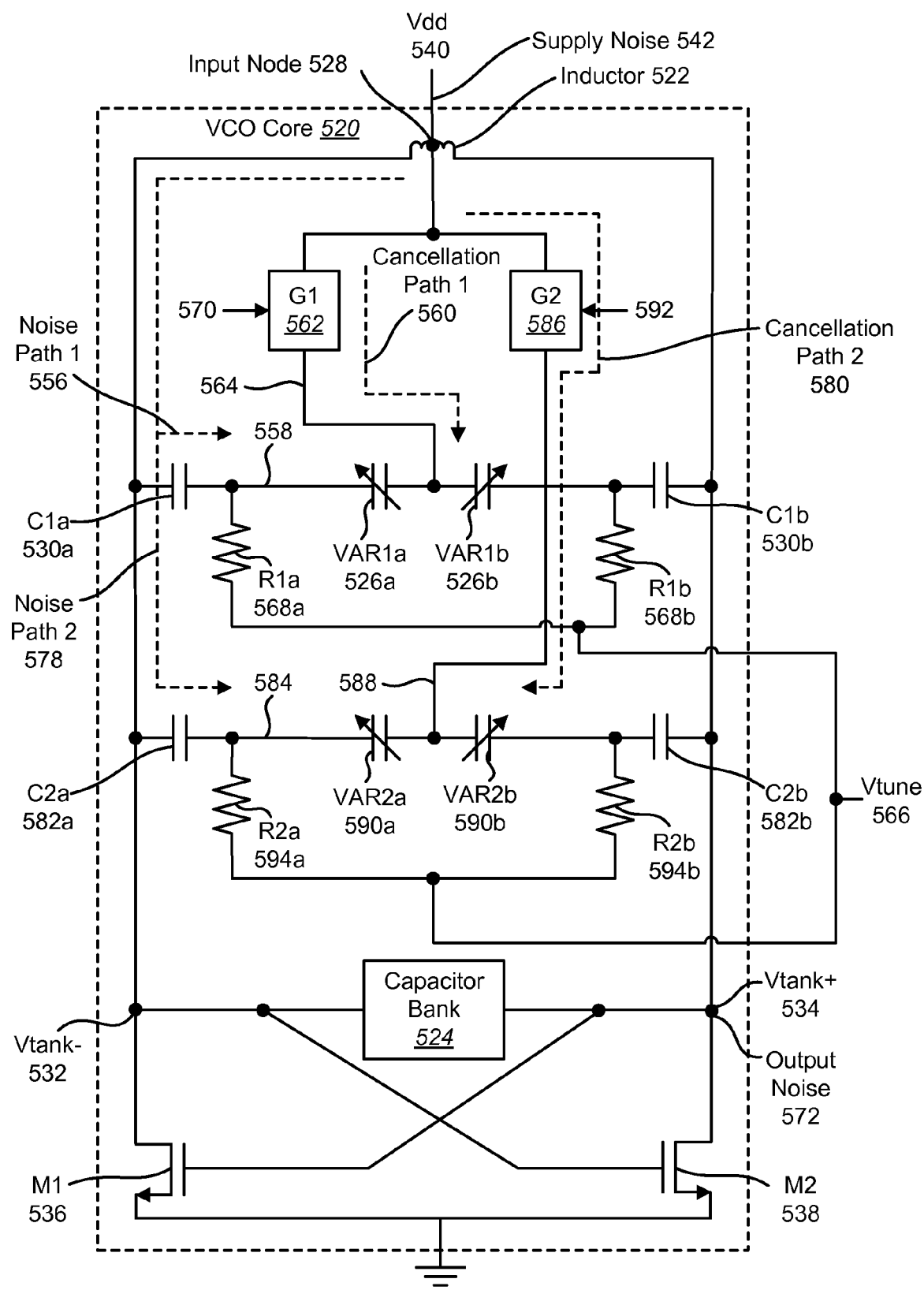
FIG. 5 is a circuit diagram illustrating a voltage controlled oscillator (VCO) core with two noise paths and two cancellation paths.

FIG. 5 is a circuit diagram illustrating a voltage controlled oscillator (VCO) core 520 with two noise paths 556, 578 and two cancellation paths 560, 580. In this configuration, the voltage controlled oscillator (VCO) core 520 may include an input node 528 that may receive a supply noise 542 combined with a supply voltage (Vdd) 540. The voltage controlled oscillator (VCO) core 520 may include one or more inductors 522, a capacitor bank 524, transistors (M1 536 and M2 538), outputs (Vtank− 532 and Vtank+ 534), a first noise path 556 and a cancellation path 560, as described above in FIG. 3. For example, the first noise path 556 may include a first capacitor (C1a) 530a and a modified noise 558. The cancellation path 560 may include a first programmable gain (G1) 562, a first varactor (VAR1a) 526a and a cancellation noise 564. The voltage controlled oscillator (VCO) core 520 may also include a second noise path 578 and a second cancellation path 580.

The supply noise 542 may follow both the first noise path 556 and the second noise path 578. For example, the supply noise 542 may be received into the voltage controlled oscillator (VCO) core 520 at the input node 528. The second noise path 578 may include a second capacitor (C2a) 582a. The supply noise 542 may cross the second capacitor (C2a) 582a to produce a second modified noise 584.

The second cancellation path 580 may connect to the input node 528 and may receive the supply noise 542. The second cancellation path 580 may include a second programmable gain (G2) 586. The second programmable gain (G2) 586 may include functionality to modify the supply noise 542 to produce a second cancellation noise 588, which may be impressed on a first terminal of a second varactor (VAR2a) 590a.

The first programmable gain (G1) 562 may be programmed based on a first control code 570, and the second programmable gain (G2) 586 may be programmed based on a second control code 592. In one configuration, the control codes 570, 592 may be different control codes. In another configuration, the control codes 570, 592 may be the same control code. For example, the control codes 570, 592 may originate from that same control source. Alternatively, the control codes 570, 592 may originate from different control sources, but the control codes 570, 592 may be the same. Additionally, the control codes 570, 592 may be based on one of a single predetermined code or an adaptive feedback control determined during operation of the voltage controlled oscillator (VCO) core 520.

The voltage controlled oscillator (VCO) core 520 may also include a tuning voltage (Vtune) 566. In one configuration, the same tuning voltage (Vtune) 566 may be applied to the first noise path 556 and the second noise path 578. As described above in FIG. 3, for the first noise path 556, the tuning voltage (Vtune) 566 may be coupled to a first side of a first resistor (R1a) 568a and a second side of the first resistor (R1a) 568a may be coupled between the first capacitor (C1a) 530a and the first varactor (VAR1a) 526a. The tuning voltage (Vtune) 566 may additionally be coupled to a first side of a resistor (R1b) 568b and a second side of the resistor (R1b) 568b may be coupled between a capacitor (C1b) 530b and the varactor (VAR1b) 526b.

For the second noise path 578, the tuning voltage (Vtune) 566 may be coupled to a first side of a second resistor (R2a) 594a and a second side of the second resistor (R2a) 594a may be coupled between the second capacitor (C2a) 582a and the second varactor (VAR2a) 590a. The tuning voltage (Vtune) 566 may additionally be coupled to a first side of a resistor (R2b) 594b and a second side of the resistor (R2b) 594b may be coupled between a capacitor (C2b) 582b and the varactor (VAR2a) 590b.

Noise cancellation may be optimized when the differences between the cancellation noises 564, 588 and the modified noises 558, 584 are minimized. For example, optimum noise cancellation may occur when the first cancellation noise 564 may equal the first modified noise 558 and the second cancellation noise 588 may equal the second modified noise 584. In other words, when the cancellation noises 564, 588 and the modified noises 558, 584 are equalized, the voltage difference across the first varactor (VAR1a) 526a and the second varactor (VAR2a) 590a may be zero. Because the capacitance of the varactors (VAR1a) 326a and (VAR2a) 590a may be a function of the voltages impressed on their terminals, when the voltages (e.g., the cancellation noises 564, 588 and the modified noises 558, 584) at each terminal of the varactors (VAR1a) 326a and (VAR2a) 590a are equalized, the capacitance of the varactors (VAR1a) 326a and (VAR2a) 590a due to noise may not change. In one configuration, the amount of noise cancellation in the voltage controlled oscillator (VCO) core 520 may be determined by measuring the output noise 572.

Figure 11:
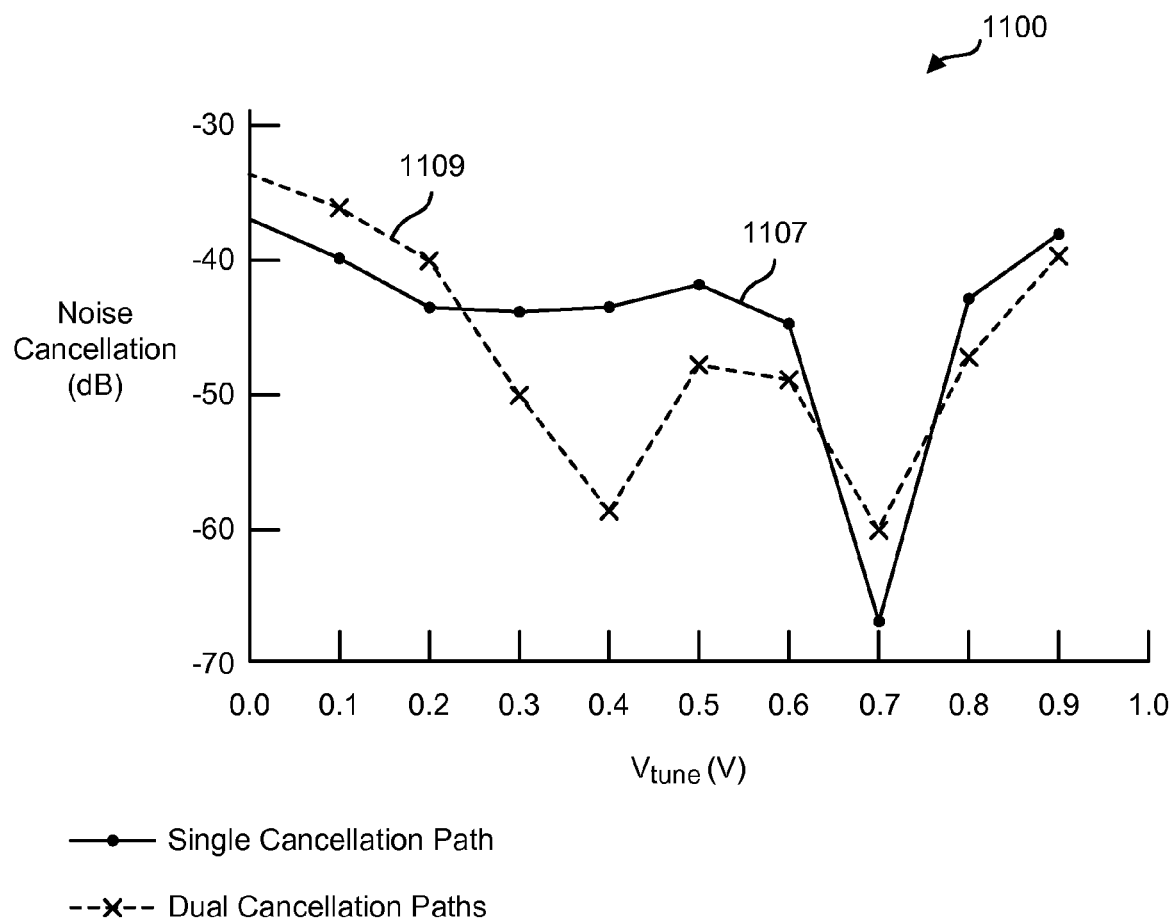
FIG. 11 is a graph illustrating noise cancellation for tuning voltages (Vtune) in a voltage controlled oscillator (VCO) core with one cancellation path and a voltage controlled oscillator (VCO) core with two cancellation paths.

Two noise cancellation paths 560, 580 may broaden noise cancellation across a range of tuning voltages. For example, in a single noise cancellation path configuration (as described in FIG. 3), noise cancellation may be significant for an optimum tuning voltage (Vtune) 566 value, but noise cancellation may quickly degrade as the tuning voltage (Vtune) 566 drifts from the optimum value. However, with two noise cancellation paths 560, 580, noise cancellation may be greater over a broader range of tuning voltage (Vtune) 566, despite the maximum noise cancellation not being as high as with a single noise cancellation path at the optimum tuning voltage (Vtune) 566. Therefore, by using two noise cancellation paths 560, 580 the voltage controlled oscillator (VCO) core 520 may achieve greater noise cancellation over a broader range of tuning voltages. The performance of two noise cancellation paths may be desirable if the tuning voltage (Vtune) 566 supplied by a phase locked loop (PLL) may drift. For example, the tuning voltage (Vtune) 566 from a phase locked loop (PLL) may change due to temperature fluctuations and/or circuit processes. Therefore, two noise cancellation paths may provide desirable noise cancellation despite changing conditions, as illustrated in FIG. 11.

As with FIG. 3, for clarity, only two noise paths (e.g., the first noise path 556 and the second noise path 578) have been described. However, it will be appreciated that symmetrical noise paths may originate from the input node 528. Additionally, the first cancellation noise 564 may also be impressed on a third varactor (VAR1b) 526b and the second cancellation noise 588 may be impressed on a fourth varactor (VAR2b) 590b.

Figure 6:
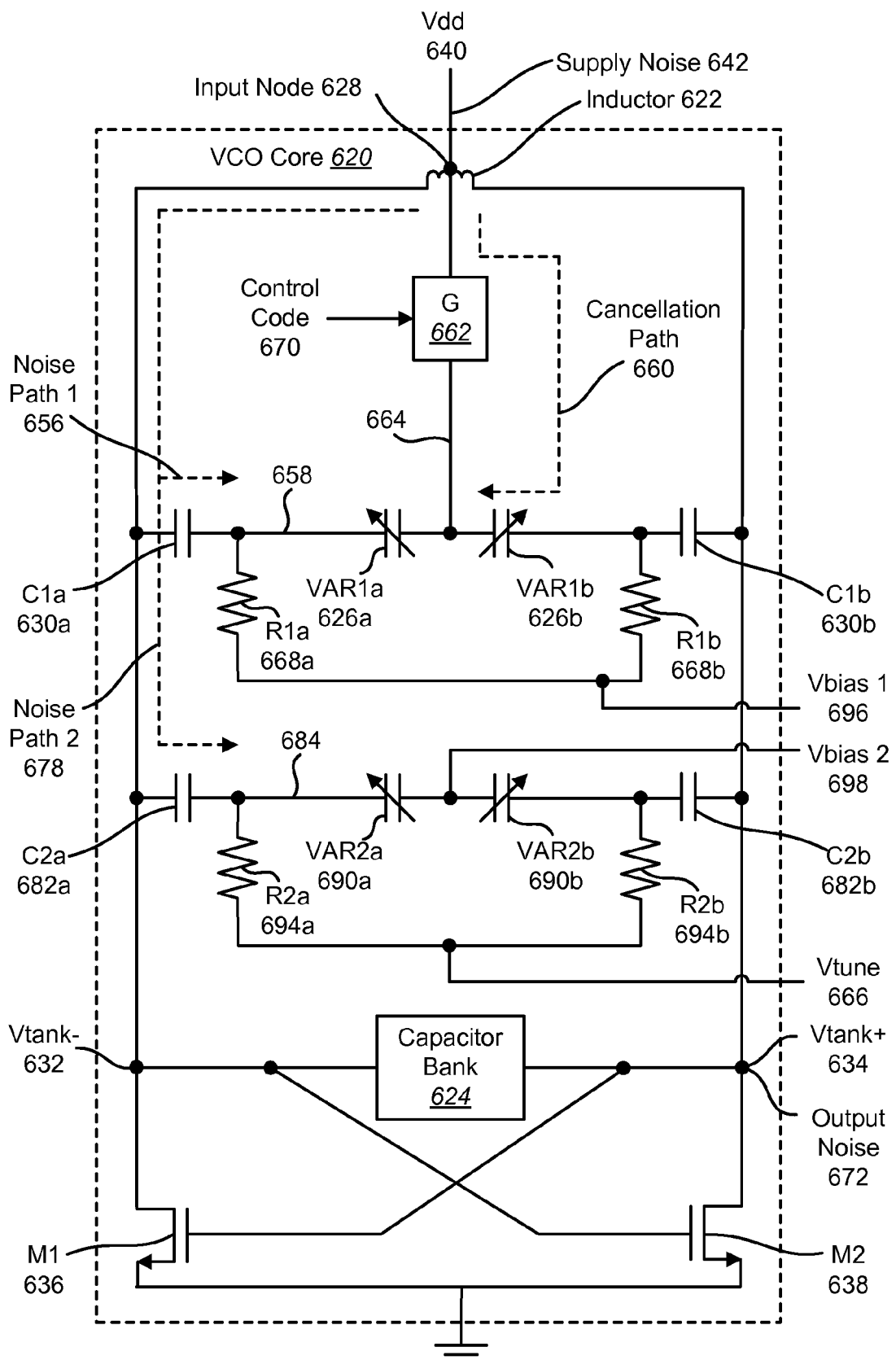
FIG. 6 is a circuit diagram illustrating a configuration of a voltage controlled oscillator (VCO) core with two noise paths and one cancellation path.

FIG. 6 is a circuit diagram illustrating a configuration of a voltage controlled oscillator (VCO) core 620 with two noise paths 656, 678 and one cancellation path 660. The voltage controlled oscillator (VCO) core 620 may include an input node 628 that may receive a supply noise 642 from a supply voltage (Vdd) 640. The voltage controlled oscillator (VCO) core 620 may include one or more inductors 622, a capacitor bank 624, transistors (M1 636 and M2 638), outputs (Vtank– 632 and Vtank+ 634), a first noise path 656 and a cancellation path 660, as described above in FIG. 3. For example, the first noise path 656 may include a first capacitor (C1a) 630a and a modified noise 658. The cancellation path 660 may include a programmable gain (G) 662, a first varactor (VAR1a) 626a and a cancellation noise 664. However, in this configuration, the tuning voltage (Vtune) 666 may be decoupled from the first noise path 656.

For instance, a first bias voltage (Vbias1) 696 may be coupled to the first resistor (R1a) 668a instead of the tuning voltage (Vtune) 666 (as compared to the configuration described in FIG. 3). The first bias voltage (Vbias1) 696 may be a voltage generated by a bias circuit, which may have very low noise or may have a good noise filter. In one configuration, the first bias voltage (Vbias1) 696 may be coupled to a first side of the resistor (R1a) 668a and a second side of the resistor (R1a) 668a may be coupled between the capacitor (C1a) 630a and the varactor (VAR1a) 626a. The first bias voltage (Vbias1) 696 may additionally be coupled to a first side of a resistor (R1b) 668b and a second side of the resistor (R1b) 668b may be coupled between the capacitor (C1b) 630b and the varactor (VAR1b) 626b.

The voltage controlled oscillator (VCO) core 620 may also include a second noise path 678. The second noise path 678 may connect to the first noise path 656 and may receive the supply noise 642. The second noise path 678 may include a second capacitor (C2a) 682a coupled to a first terminal of a second varactor (VAR2a) 690a. The supply noise 642 may cross the second capacitor (C2a) 682a to produce a second modified noise 684.

The voltage controlled oscillator (VCO) core 620 may include a tuning voltage (Vtune) 666 and a second bias voltage (Vbias2) 698 coupled to the second noise path 678. For example, the tuning voltage (Vtune) 666 may be received from a phase-locked loop (PLL). The tuning voltage (Vtune) 666 may be coupled with a first side of a second resistor (R2a) 694a and a second side of the second resistor (R2a) 694a may be coupled between the second capacitor (C2a) 682a and the first terminal of the second varactor (VAR2a) 690a. The tuning voltage (Vtune) 666 may additionally be coupled with a first side of a resistor (R2b) 694b and a second side of the resistor (R2b) 694b may be coupled between the capacitor (C2b) 682b and the first terminal of the varactor (VAR2b) 690b. The second bias voltage (Vbias2) 698 may be coupled to a second terminal of the second varactor (VAR2a) 690a. The second bias voltage (Vbias2) 698 may additionally be coupled to a second terminal of the varactor (VAR2b) 690b.

The programmable gain (G) 662 may be adjusted to minimize the output noise 672. The programmable gain (G) 662 may be adjusted as described above in FIG. 3. For example, the programmable gain (G) 662 may be adjusted based on one or more control code 670. In one configuration, the programmable gain (G) 662 may be adjusted until the cancellation noise 664 may substantially equal the modified noise 658. In another configuration, the programmable gain (G) 662 may be adjusted until the observed output noise 672 is minimized.

Figure 7:
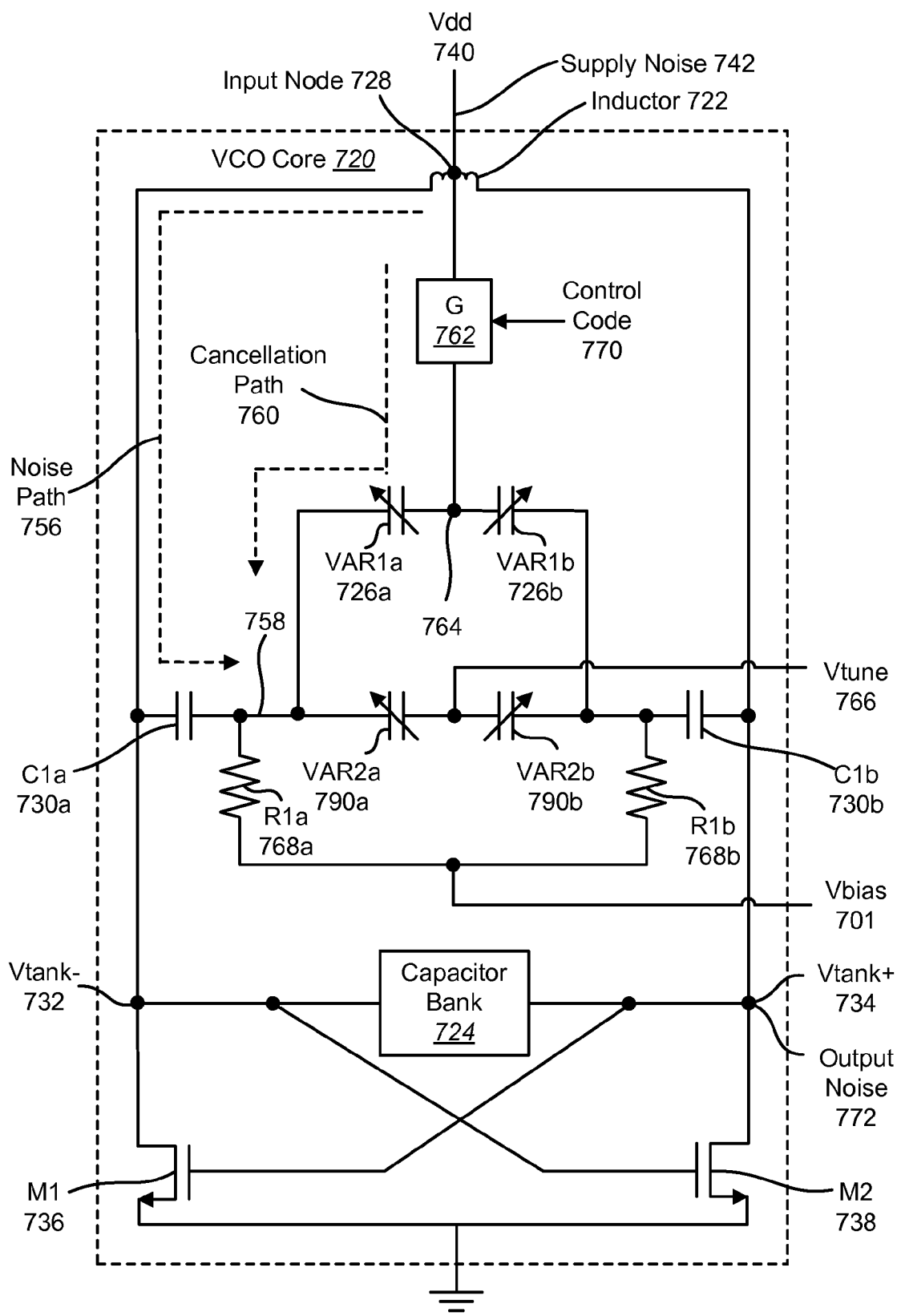
FIG. 7 is a circuit diagram illustrating another configuration of a voltage controlled oscillator (VCO) core with a noise path and a cancellation path.

FIG. 7 is a circuit diagram illustrating another configuration of a voltage controlled oscillator (VCO) core 720 with a noise path 756 and a cancellation path 760. The voltage controlled oscillator (VCO) core 720 may include an input node 728 that may receive a supply noise 742 from a supply voltage (Vdd) 740. The voltage controlled oscillator (VCO) core 720 may include one or more inductors 722, a capacitor bank 724, transistors (M1 736 and M2 738), outputs (Vtank– 732 and Vtank+ 734), a noise path 756 and a cancellation path 760, as described above in FIG. 3. For example, the first noise path 756 may include a capacitor (C1a) 730a and a modified noise 758. The cancellation path 760 may include a programmable gain (G) 762, a first varactor (VAR1a) 726a and a cancellation noise 764.

In this configuration, the cancellation path 760 may be decoupled from a tuning voltage (Vtune) 766. For example, the voltage controlled oscillator (VCO) core 720 may include a second varactor (VAR2a) 790a that may be coupled to the capacitor (C1a) 730a and the first varactor (VAR1a) 726a. For instance, a first terminal of the second varactor (VAR2a) 790a may be coupled to the junction of the capacitor (C1a) 730a and the first varactor (VAR1a) 726a. A bias voltage (Vbias) 701 may be coupled to a first side of a resistor (R1a) 768a and a second side of the resistor (R1a) 768a may be coupled between the capacitor (C1a) 730a and the second varactor (VAR2a) 790a. The bias voltage (Vbias) 701 may additionally be coupled to a first side of a resistor (R1b) 768b and a second side of the resistor (R1b) 768b may be coupled between the capacitor (C1b) 730b and the varactor (VAR2b) 790b. A tuning voltage (Vtune) 766 may be coupled to a second terminal of the second varactor (VAR2a) 790a.

The programmable gain (G) 762 may be adjusted to minimize the output noise 772. The programmable gain (G) 762 may be adjusted as described above in FIG. 3. For example, the programmable gain (G) 762 may be adjusted based on one or more control codes 770. In one configuration, the programmable gain (G) 762 may be adjusted until the cancellation noise 764 may substantially equal the modified noise 758. In another configuration, the programmable gain (G) 762 may be adjusted until the observed output noise 772 is minimized.

As with FIG. 3, it will be appreciated that a symmetrical noise path may originate from the input node 728. Furthermore, the cancellation noise 764 may also be impressed on a varactor (VAR1b) 726b.

Figure 8:
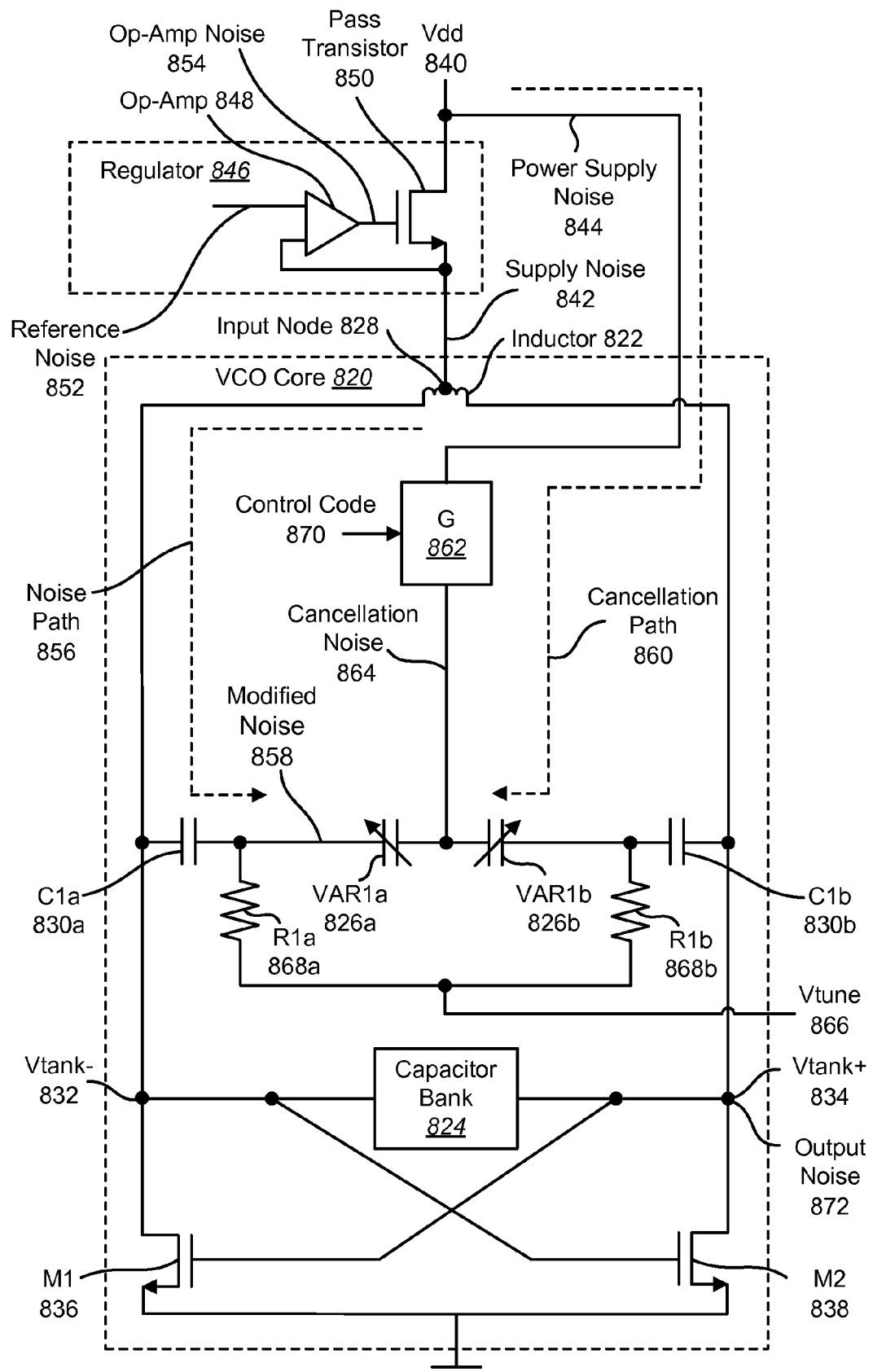
FIG. 8 is a circuit diagram illustrating a voltage controlled oscillator (VCO) core in which a cancellation path bypasses a regulator.

FIG. 8 is a circuit diagram illustrating a voltage controlled oscillator (VCO) core 820 in which a cancellation path 860 bypasses a regulator 846. The voltage controlled oscillator (VCO) core 820 may include an input node 828 that may receive a supply noise 842 from a supply voltage (Vdd) 840. The voltage controlled oscillator (VCO) core 820 may include one or more inductors 822, a capacitor bank 824, transistors (M1 836 and M2 838), outputs (Vtank– 832 and Vtank+ 834), and a noise path 856 as described above in FIG. 3. For example, the first noise path 856 may include a capacitor (C1a) 830a and a modified noise 858. A cancellation path 860 may include a programmable gain (G) 862, a first varactor (VAR1a) 826a and a cancellation noise 864.

A tuning voltage (Vtune) 866 may be coupled to a first side of a resistor (R1a) 868a and a second side of the resistor (R1a) 868a may be coupled between the capacitor (C1a) 830a and the varactor (VAR1a) 826a. The tuning voltage (Vtune) 866 may additionally be coupled to a first side of a resistor (R1b) 868b and a second side of the resistor (R1b) 868b may be coupled between the capacitor (C1b) 830b and the varactor (VAR1b) 826b.

Additionally, a regulator 846 may be coupled to the supply voltage (Vdd) 840 provided by an external power supply. The regulator 846 may include an op-amp 848 and a pass transistor 850. The regulator 846 may additionally include a reference noise 852 and an op-amp noise 854 that may be received by the voltage controlled oscillator (VCO) core 820.

In this configuration, the cancellation path 860 may bypass the regulator 846. For example, one end of the cancellation path 860 may be coupled to the supply voltage (Vdd) 840 before it enters the regulator 846. The power supply noise 844 may then pass through the programmable gain (G) 862 to produce the cancellation noise 864. The programmable gain (G) 862 may be adjusted to minimize the output noise 872. The programmable gain (G) 862 may be adjusted based on one or more control codes 870 as described above in FIG. 3. This configuration may be beneficial when the power supply noise 844 may be significantly greater than the noise contribution of the regulator 846 (e.g., the reference noise 852 and the op-amp noise 854).

Figure 9:
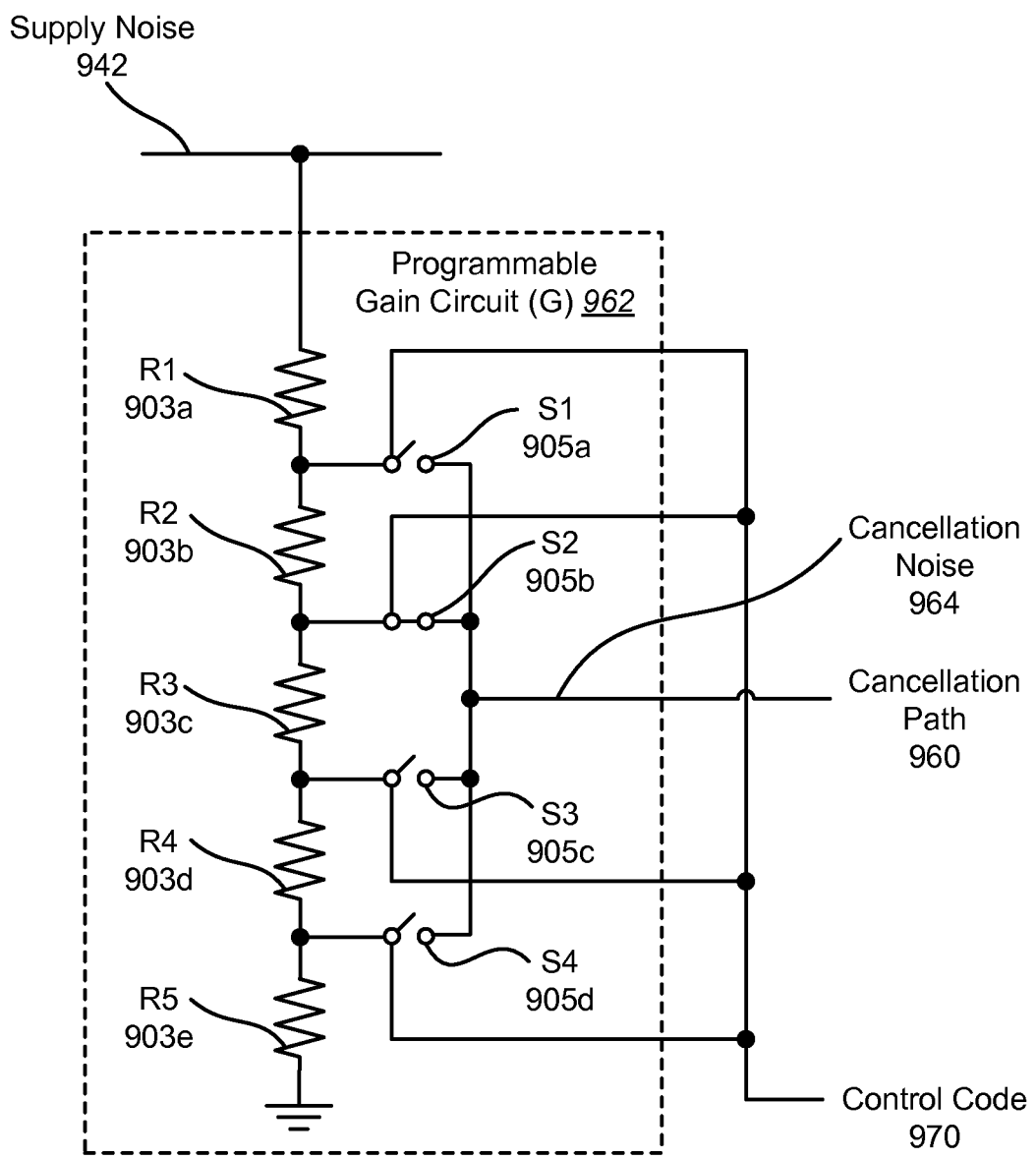
FIG. 9 is a circuit diagram illustrating a configuration for a programmable gain circuit (G)

FIG. 9 is a circuit diagram illustrating a configuration for a programmable gain circuit (G) 962. The programmable gain circuit (G) 962 may alter a supply noise 942 to produce a cancellation noise 964. The programmable gain block may include active or passive elements, with passive elements being preferred for simplicity. In one configuration, the programmable gain circuit (G) 962 may include a resistor ladder switch assembly that may function as an adjustable voltage divider. For example, the resistor ladder may be implemented as a string resistor ladder network. In one possible configuration, resistors 903a-e may be coupled in series between the supply noise 942 and ground. The resistors 903a-e may act as a voltage divider between the supply noise 942 and ground. The resistors 903a-e may be equal or unequal resistance values. It will be appreciated that any number of resistors greater than two may be used in the string resistor ladder network to increase the resolution of the programmable gain circuit (G) 962.

A plurality of controllable switches 905a-d may be coupled at the junction between each resistor 903a-e. For example, switch S1 905a may be coupled to the junction between R1 903a and R2 903b. Switch S2 905b may be coupled to the junction between R2 903b and R3 903c, and so on. The number of switches may be one less than the number of resistors included in the string resistor ladder network. By selecting which switch is open, the supply noise 942 may be adjusted by a particular gain. For instance, if S2 905b is closed, the gain may be equal to the sum of R1 903a and R2 903b divided by the total resistance of the resistors 903a-e. The cancellation noise 964 may be the output of the voltage divider. In other words, the cancellation noise 964 may equal the supply noise 942 multiplied by the gain. The switches 905a-d may be coupled to a cancellation path 960 to which the cancellation noise 964 may be impressed.

The switches 905a-d may receive a control code 970 that may indicate whether a particular switch may open or close. For example, the control code 970 may indicate that S2 905b may close and the remaining switches may open. In one configuration, the control code 970 may be an individual signal sent to each switch 905a-d. In another configuration, the control code 970 may include separate control signals 970 that may be sent to each switch 905a-d. The control code 970 may be based on one of a single predetermined code or issued by an adaptive control 974, which may determine adaptive control codes 976 during operation of the voltage controlled oscillator (VCO) core 920.

The programmable gain circuit (G) 962 may additionally include amplification circuitry (not shown) that may amplify the cancellation noise 964. Additionally and/or alternatively, the programmable gain circuit (G) 962 may be implemented using one or more op-amps 848 to adjust the gain of the supply noise 942.

Figure 10:
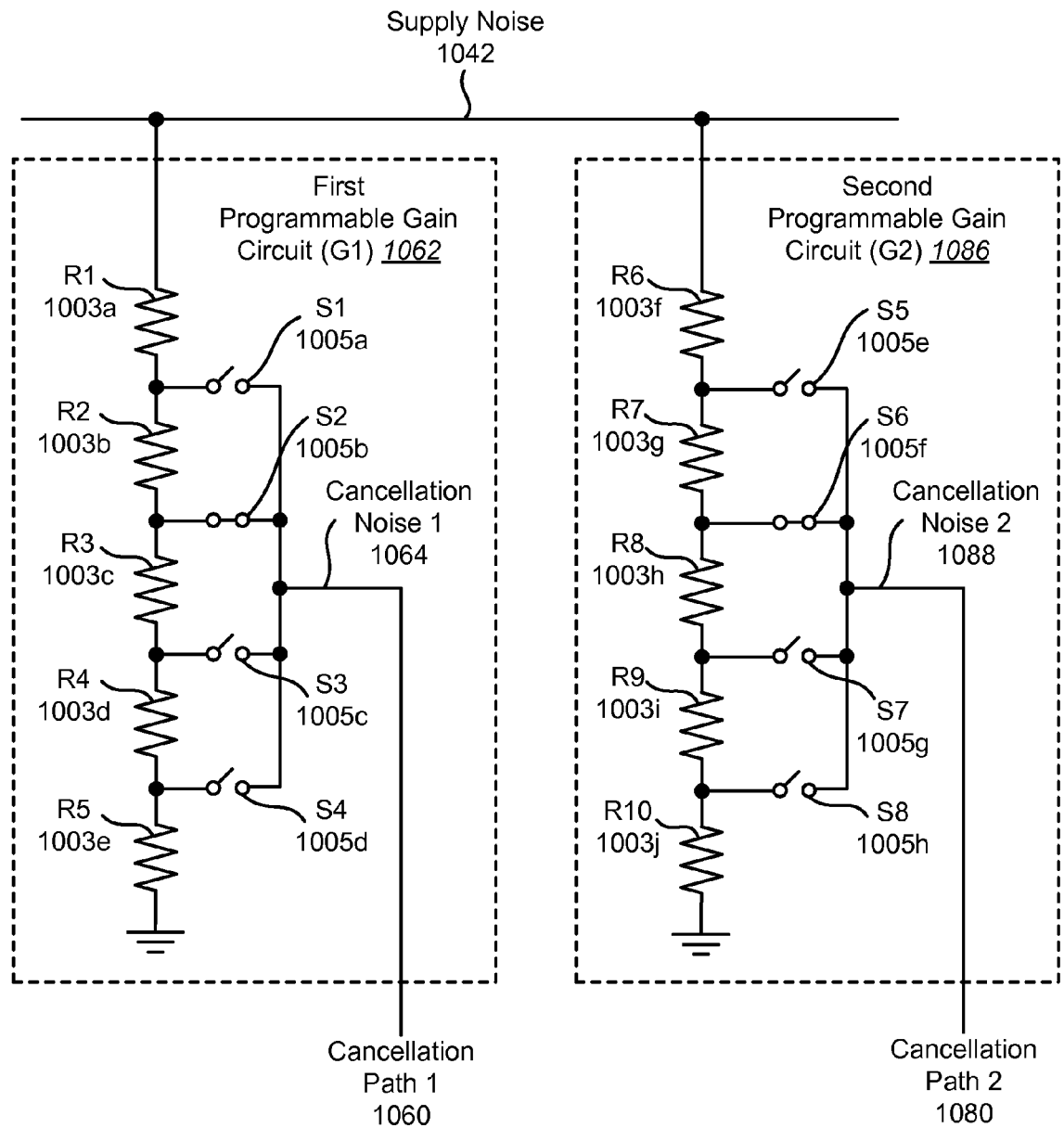
FIG. 10 is a circuit diagram illustrating a configuration for two programmable gain circuits.

FIG. 10 is a circuit diagram illustrating a configuration for two programmable gain circuits 1062, 1086. The programmable gain circuits 1062, 1086 may be implemented using resistor ladder switch assemblies as described above in FIG. 9. For example, a first programmable gain circuit (G1) 1062 may include five resistors 1003a-e that may be coupled in series between the supply noise 1042 and ground. Additionally, the first programmable gain circuit (G1) 1062 may include four controllable switches 1005a-d that may be coupled at the junction between each resistor 1003a-e and connect to a first cancellation path 1060. The switches 1005a-d may be controlled based on a first control code. A first cancellation noise 1064 may be produced based on which of the switches 1005a-d may be open or closed. The first cancellation noise 1064 may be impressed on the first cancellation path 1060.

A second programmable gain circuit (G2) 1086 may also be implemented as a resistor ladder switch assembly as described in FIG. 9. For example, a second programmable gain circuit (G2) 1086 may include five resistors 1003f-j that may be coupled in series between the supply noise 1042 and ground. Additionally, the second programmable gain circuit (G2) 1086 may include four controllable switches 1005e-h that may be coupled at the junction between each resistor 1003f-j and connect to a second cancellation path 1080. The switches 1005e-h may be controlled based on a second control code. A second cancellation noise 1088 may be produced based on which of the switches 1005e-h may be open or closed. The second cancellation noise 1088 may be impressed on the second cancellation path 1080.

It will be appreciated that the number of resistors and switches in each programmable gain (G1) 1062 and (G2) 1086 may vary from the configuration depicted in FIG. 10. For example, each programmable gain (G1) 1062 and (G2) 1086 may have two or more resistors in the string resistor ladder. Additionally, the first programmable gain circuit (G1) 1062 may have more or fewer resistors in the string resistor ladder than the second programmable gain (G2) 1086.

FIG. 11 is a graph 1100 illustrating noise cancellation for tuning voltages (Vtune) 366, 566 in a voltage controlled oscillator (VCO) core 320 with one cancellation path 360 and a voltage controlled oscillator (VCO) core 320, 520 with two cancellation paths 560, 580. Noise cancellation is shown as a reduction in decibels over a range of tuning voltages (Vtune) 366, 566 with a greater negative value representing increased noise reduction.

A single cancellation path curve 1107 depicts the noise cancellation for a specific configuration of a voltage controlled oscillator (VCO) core 320 with one cancellation path 360. The voltage controlled oscillator (VCO) core 320 may be similar to the voltage controlled oscillator (VCO) core 320 described in connection with FIG. 3. In this configuration, the first capacitor (C1a) 330a has a capacitance of 450 femtofarads, the first varactor (VAR1a) 326a has a capacitance of 570 femtofarads and the programmable gain (G) 362 has a value of 0.5. Optimal noise cancellation for this single cancellation path configuration occurs at a tuning voltage (Vtune) 366 of 0.7 volts. The noise cancellation experiences a sharp spike at 0.7 volts and drops off sharply with both higher and lower tuning voltages (Vtune).

A dual cancellation path curve 1109 depicts the noise cancellation for a specific configuration of a voltage controlled oscillator (VCO) core 520 with two cancellation paths 560, 580. The voltage controlled oscillator (VCO) core 520 may be similar to the voltage controlled oscillator (VCO) core 520 described in connection with FIG. 5. In this configuration, the first capacitor (C1a) 530*a* has a capacitance of 225 femtofarads, the first varactor (VAR1a) 526*a* has a capacitance of 570 femtofarads and the first programmable gain (G1) 562 has a value of 0.5. The second capacitor (C2a) 582*a* has a capacitance of 175 femtofarads, the second varactor (VAR2a) 590*a* has a capacitance of 228 femtofarads and the second programmable gain (G2) 586 has a value of 0.8.

Optimal noise cancellation for this dual cancellation path configuration also occurs at a tuning voltage (Vtune) 566 of 0.7 volts. A second spike in noise cancellation occurs at a tuning voltage (Vtune) 566 of 0.4 volts. The noise cancellation in the dual cancellation path curve 1109 does not drop off as sharply as the noise cancellation seen in the single cancellation path curve 1107. Therefore, the dual cancellation path curve 1109 does not experience as much fluctuation in noise cancellation over the tuning voltage (Vtune) 566 range of 0.2-0.9 volts. While the maximum noise cancellation of the dual cancellation path configuration may be less than the single cancellation path configuration, the dual cancellation path configuration may experience a more stable noise cancellation (e.g., the average noise cancellation may be greater) over a broader range of tuning voltages (Vtune).

As described above in connection with FIG. 5, the performance of dual cancellation path configuration may be desirable if the tuning voltage (Vtune) 566 is supplied by a phase locked loop (PLL). For example, the tuning voltage (Vtune) 566 supplied by a phase locked loop (PLL) may change due to temperature fluctuations and/or circuit processes. Therefore, two noise cancellation paths may provide desirable noise cancellation despite changing conditions.

Figure 12:
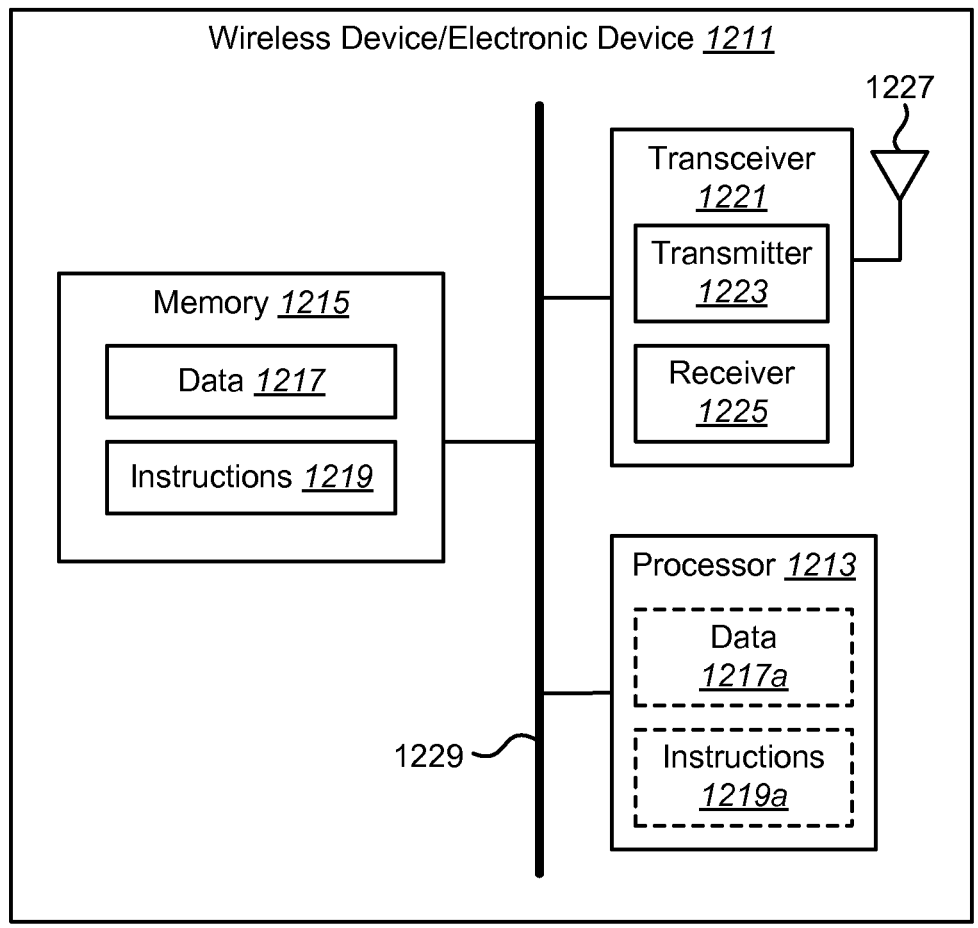
FIG. 12 illustrates certain components that may be included within a wireless device/electronic device.

FIG. 12 illustrates certain components that may be included within a wireless device/electronic device 1211. The electronic device/wireless device 1211 may be an access terminal, a mobile station, a user equipment (UE), a base station, an access point, a broadcast transmitter, a node B, an evolved node B, etc. For example, the electronic device/wireless device 1211 may include the receiver 100 or transmitter 200 illustrated in FIGS. 1 and 2, respectively. The wireless device/electronic device 1211 may include a processor 1213. The processor 1213 may be a general purpose single- or multi-chip microprocessor (e.g., an ARM), a special purpose microprocessor (e.g., a digital signal processor (DSP)), a microcontroller, a programmable gate array, etc. The processor 1213 may be referred to as a central processing unit (CPU). Although just a single processor 1213 is shown in the wireless device/electronic device 1211 of FIG. 11, in an alternative configuration, a combination of processors (e.g., an ARM and DSP) could be used.

The wireless device/electronic device 1211 also includes memory 1215 in electronic communication with the processor 1213 (i.e., the processor 1213 can read information from and/or write information to the memory 1215). The memory 1215 may be any electronic component capable of storing electronic information. The memory 1215 may be random access memory (RAM), read-only memory (ROM), magnetic disk storage media, optical storage media, flash memory devices in RAM, on-board memory included with the processor, programmable read-only memory (PROM), erasable programmable read-only memory (EPROM), electrically erasable PROM (EEPROM), registers, and so forth, including combinations thereof.

Data 1217 and instructions 1219 may be stored in the memory 1215. The instructions 1219 may include one or more programs, routines, sub-routines, functions, procedures, etc. The instructions 1219 may include a single computer-readable statement or many computer-readable statements. The instructions 1219 may be executable by the processor 1213 to implement the methods that were described above. Executing the instructions 1219 may involve the use of the data 1217 that is stored in the memory 1215. FIG. 12 shows some instructions 1219*a* and data 1217*a* being loaded into the processor 1213.

The wireless device/electronic device 1211 may also include a transmitter 1223 and a receiver 1225 to allow transmission and reception of signals between the wireless device/electronic device 1211 and a remote location. The transmitter 1223 and receiver 1225 may be collectively referred to as a transceiver 1221. An antenna 1227 may be electrically coupled to the transceiver 1221. The wireless device/electronic device 1211 may also include (not shown) multiple transmitters, multiple receivers, multiple transceivers and/or multiple antennas.

The various components of the wireless device/electronic device 1211 may be coupled together by one or more buses, which may include a power bus, a control signal bus, a status signal bus, a data bus, etc. For simplicity, the various buses are illustrated in FIG. 12 as a bus system 1229.

In the above description, reference numbers have sometimes been used in connection with various terms. Where a term is used in connection with a reference number, this may be meant to refer to a specific element that is shown in one or more of the Figures. Where a term is used without a reference number, this may be meant to refer generally to the term without limitation to any particular Figure.

It should be noted that the terms "couple," "coupling," "coupled" or other variations of the word couple as used herein may indicate either an indirect connection or a direct connection. For example, if a first component is "coupled" to a second component, the first component may be either indirectly connected (e.g., through one or more other components) to the second component or directly connected to the second component.

Additionally, it should be noted that as used herein, designating a component, element or entity (e.g., transistor, capacitor, resistor, power supply, circuit, filter, switch, block, module, etc.) as a "first," "second," "third" or "fourth" component, etc., may be used to distinguish components for explanatory clarity. It should also be noted that labels used to designate a "first," "second," "third" or "fourth," component etc., do not necessarily imply a particular order or that elements with lower value labels are included or used.

As used herein, the terms "circuit," "circuitry" and other variations of the term "circuit" may denote at least one structural element or component. For example, circuitry may include one or more elements or components such as resistors, capacitors, inductors, transistors, amplifiers, transformers, flip-flops, registers, etc. Additionally or alternatively, circuitry may be an aggregate of circuit components, such as integrated circuit components, in the form of processing and/or memory cells, units, blocks and/or other components.

The term "determining" encompasses a wide variety of actions and, therefore, "determining" can include calculating, computing, processing, deriving, investigating, looking up (e.g., looking up in a table, a database or another data structure), ascertaining and the like. Also, "determining" can include receiving (e.g., receiving information), accessing (e.g., accessing data in a memory) and the like. Also, "determining" can include resolving, selecting, choosing, establishing and the like.

The phrase "based on" does not mean "based only on," unless expressly specified otherwise. In other words, the phrase "based on" describes both "based only on" and "based at least on."

The functions described herein may be stored as one or more instructions on a processor-readable or computer-readable medium. The term "computer-readable medium" refers to any available medium that can be accessed by a computer or processor. By way of example, and not limitation, such a medium may comprise RAM, ROM, EEPROM, flash memory, CD-ROM or other optical disk storage, magnetic disk storage or other magnetic storage devices, or any other medium that can be used to store desired program code in the form of instructions or data structures and that can be accessed by a computer. Disk and disc, as used herein, includes compact disc (CD), laser disc, optical disc, digital versatile disc (DVD), floppy disk and Blu-ray® disc where disks usually reproduce data magnetically, while discs reproduce data optically with lasers. It should be noted that a computer-readable medium may be tangible and non-transitory. The term "computer-program product" refers to a computing device or processor in combination with code or instructions (e.g., a "program") that may be executed, processed or computed by the computing device or processor. As used herein, the term "code" may refer to software, instructions, code or data that is/are executable by a computing device or processor.

Software or instructions may also be transmitted over a transmission medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of transmission medium.

The methods disclosed herein comprise one or more steps or actions for achieving the described method. The method steps and/or actions may be interchanged with one another without departing from the scope of the claims. In other words, unless a specific order of steps or actions is required for proper operation of the method that is being described, the order and/or use of specific steps and/or actions may be modified without departing from the scope of the claims.

It is to be understood that the claims are not limited to the precise configuration and components illustrated above. Various modifications, changes and variations may be made in the arrangement, operation and details of the systems, methods, and apparatus described herein without departing from the scope of the claims.

What is claimed is:

1. A voltage controlled oscillator (VCO) core for cancelling a supply noise, comprising:
   an input node that receives the supply noise;
   a noise path coupled to the input node; and
   a cancellation path coupled to the input node and the noise path, wherein the cancellation path comprises a programmable gain circuit coupled with a first terminal of a varactor, and wherein the supply noise received at the input node of the VCO core passes through the programmable gain circuit to produce a cancellation noise for cancelling out effects of the supply noise.

2. The VCO core of claim 1, wherein the supply noise comprises a combination of a power supply noise and a regulator noise.

3. The VCO core of claim 1, wherein the supply noise comprises one or more of a random noise and a tone.

4. The VCO core of claim 1, wherein the programmable gain circuit is adjusted to minimize a VCO core output noise.

5. The VCO core of claim 1, wherein the noise path further comprises a capacitor coupled to a second terminal of the varactor, and wherein the supply noise passes through the capacitor to produce a modified noise.

6. The VCO core of claim 5, wherein the programmable gain circuit is adjusted until a difference between the cancellation noise and the modified noise is minimized.

7. The VCO core of claim 5, further comprising a tuning voltage coupled to a first side of a resistor, wherein a second side of the resistor is coupled between the capacitor and the varactor.

8. The VCO core of claim 7, further comprising:
   a second cancellation path coupled to the input node and the noise path, wherein the second cancellation path comprises a second programmable gain circuit coupled with a first terminal of a second varactor, and wherein the supply noise passes through the second programmable gain circuit to produce a second cancellation noise;
   a second noise path coupled to the noise path, wherein the second noise path comprises a second capacitor coupled with a second terminal of the second varactor, and wherein the supply noise passes through the second capacitor to produce a second modified noise;
   the tuning voltage coupled to a first side of a second resistor, wherein a second side of the second resistor is coupled between the second capacitor and the second varactor; and
   the second programmable gain circuit is adjusted until a difference between the second cancellation noise and the second modified noise is minimized.

9. The VCO core of claim 8, wherein the programmable gain circuit is controlled by a first control code, and the second programmable gain circuit is controlled by a second control code.

10. The VCO core of claim 5, further comprising:
    a second noise path coupled to the noise path, wherein the second noise path further comprises a second capacitor coupled with a first terminal of a second varactor, and wherein the supply noise passes through the second capacitor to produce a second modified noise;
    a first bias voltage coupled to a first side of a first resistor, wherein a second side of the first resistor is coupled between the capacitor and the varactor;
    a tuning voltage applied to a first side of a second resistor, wherein a second side of the second resistor is coupled between the second capacitor and a first terminal of the second varactor; and
    a second bias voltage applied to a second terminal of the second varactor,
    wherein the programmable gain circuit is adjusted until a difference between the cancellation noise and the modified noise is minimized.

11. The VCO core of claim 10, wherein the noise path further comprises a capacitor coupled to a first terminal of a second varactor, wherein the supply noise passes through the capacitor to produce a modified noise, and wherein the second terminal of the varactor is coupled between the capacitor and the second varactor.

12. The VCO core of claim 11, further comprising:
a bias voltage coupled to a first side of a resistor, wherein a second side of the resistor is coupled between the capacitor and the second varactor; and
a tuning voltage coupled to a second terminal of the second varactor.

13. The VCO core of claim 1, wherein the programmable gain circuit comprises a resistor ladder switch assembly comprising:
a plurality of coupled resistors; and
a plurality of switches coupled to junctions of the resistors, wherein the gain is based on a state of the switches, and wherein the state of the switches is based on a control code.

14. The VCO core of claim 13, wherein the control code is based on one of a single predetermined code or an adaptive control determined during operation of the VCO core.

15. A method for cancelling a supply noise in a voltage controlled oscillator (VCO) core, comprising:
receiving the supply noise at an input node of the VCO core;
modifying the supply noise received at the input node of the VCO core using a capacitor coupled to a varactor to produce a modified noise;
producing a cancellation noise by passing the supply noise through a programmable gain circuit; and
adjusting the programmable gain circuit until a difference between the cancellation noise and the modified noise is minimized so that effects of the supply noise is cancelled out by the cancellation noise.

16. The method of claim 15, further comprising applying a tuning voltage coupled to a first side of a resistor, wherein a second side of the resistor is coupled between the capacitor and the varactor.

17. The method of claim 15, wherein producing the cancellation noise comprises adjusting the programmable gain circuit based on a control code, wherein the programmable gain circuit comprises a resistor ladder switch assembly comprising:
a plurality of coupled resistors; and
a plurality of switches coupled to junctions of the resistors, wherein the gain is based on a state of the switches, and wherein the state of the switches is based on the control code.

18. The method of claim 15, wherein adjusting the programmable gain circuit comprises receiving a control code based on one of a single predetermined code or an adaptive control determined during operation of the VCO core.

19. The method of claim 15, further comprising:
modifying the supply noise using a second capacitor coupled to a second varactor to produce a second modified noise;
producing a second cancellation noise by passing the supply noise through a second programmable gain circuit; and
adjusting the second programmable gain circuit until a difference between the second cancellation noise and the second modified noise is minimized.

20. An apparatus for cancelling a supply noise in a voltage controlled oscillator (VCO) core, comprising:
means for receiving the supply noise into the VCO core;
means for modifying the supply noise received at an input node of the VCO core using a capacitor coupled to a varactor to produce a modified noise;
means for producing a cancellation noise by passing the supply noise through a programmable gain circuit; and
means for adjusting the programmable gain circuit until a difference between the cancellation noise and the modified noise is minimized so that effects of the supply noise is cancelled out by the cancellation noise.

21. The apparatus of claim 20, further comprising means for applying a tuning voltage to the VCO core.

22. The apparatus of claim 20, wherein the programmable gain circuit comprises a resistor ladder switch assembly comprising:
a plurality of coupled resistors; and
a plurality of switches coupled to junctions of the resistors, wherein the gain is based on a state of the switches, and wherein the state of the switches is based on a control code.

23. The apparatus of claim 20, further comprising means for receiving, at the programmable gain circuit, a control code based on one of a single predetermined code or an adaptive control determined during operation of the VCO core.

24. The apparatus of claim 20, further comprising:
means for modifying the supply noise using a second capacitor coupled to a second varactor to produce a second modified noise;
means for producing a second cancellation noise by passing the supply noise through a second programmable gain circuit; and
means for adjusting the second programmable gain circuit until a difference between the second cancellation noise and the second modified noise is minimized.

25. An integrated circuit, comprising:
an input node that receives a supply noise;
a noise path coupled to the input node; and
a cancellation path coupled to the input node and the noise path, wherein the cancellation path comprises a programmable gain circuit coupled with a first terminal of a varactor, and wherein the supply noise passes through the programmable gain circuit to produce a cancellation noise for cancelling out effects of the supply noise.

26. The integrated circuit of claim 25, wherein the noise path further comprises a capacitor coupled to a second terminal of the varactor, and wherein the supply noise passes through the capacitor to produce a modified noise.

27. The integrated circuit of claim 26, further comprising a tuning voltage coupled to a first side of a resistor, wherein a second side of the resistor is coupled between the capacitor and the varactor.

28. The integrated circuit of claim 27, wherein the programmable gain circuit is adjusted until a difference between the cancellation noise and the modified noise is minimized.

29. The integrated circuit of claim 27, wherein the programmable gain circuit is adjusted to minimize an output noise.

30. The integrated circuit of claim 25, wherein the programmable gain circuit comprises a resistor ladder switch assembly comprising:
a plurality of coupled resistors; and
a plurality of switches coupled to junctions of the resistors, wherein the gain is based on a state of the switches, and wherein the state of the switches is based on a control code.

31. The integrated circuit of claim 28, further comprising:
a second cancellation path coupled to the input node and the noise path, wherein the second cancellation path comprises a second programmable gain circuit coupled with a first terminal of a second varactor, and wherein the supply noise passes through the second programmable gain circuit to produce a second cancellation noise;

a second noise path coupled to the noise path, wherein the second noise path comprises a second capacitor coupled with a second terminal of the second varactor, and wherein the supply noise passes through the second capacitor to produce a second modified noise;

the tuning voltage coupled to a first side of a second resistor, wherein a second side of the second resistor is coupled between the second capacitor and the second varactor; and the second programmable gain circuit is adjusted until a difference between the second cancellation noise and the second modified noise is minimized.

32. The integrated circuit of claim 26, further comprising:

a second noise path coupled to the noise path, wherein the second noise path further comprises a second capacitor coupled with a first terminal of a second varactor, and wherein the supply noise passes through the second capacitor to produce a second modified noise;

a first bias voltage coupled to a first side of a first resistor, wherein a second side of the first resistor is coupled between the capacitor and the varactor;

a tuning voltage applied to a first side of a second resistor, wherein a second side of the second resistor is coupled between the second capacitor and a first terminal of the second varactor; and a second bias voltage applied to a second terminal of the second varactor, wherein the programmable gain circuit is adjusted until a difference between the cancellation noise and the modified noise is minimized.

* * * * *